(12) United States Patent
Fujimori et al.

(10) Patent No.: US 7,772,622 B2
(45) Date of Patent: Aug. 10, 2010

(54) FIELD EFFECT TRANSISTOR AND MANUFACTURING METHOD THEREOF

(75) Inventors: Masaaki Fujimori, Hatoyama (JP); Tomihiro Hashizume, Hatoyama (JP); Masahiko Ando, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 777 days.

(21) Appl. No.: 11/733,794

(22) Filed: Apr. 11, 2007

(65) Prior Publication Data

US 2007/0252229 A1 Nov. 1, 2007

(30) Foreign Application Priority Data

Apr. 26, 2006 (JP) .............................. 2006-121540

(51) Int. Cl.
*H01L 29/80* (2006.01)
*H01L 21/84* (2006.01)

(52) U.S. Cl. ............... 257/286; 257/401; 257/E29.052; 257/E29.116; 257/E21.619; 438/161; 438/666

(58) Field of Classification Search ................ 257/286, 257/401, E29.052, E29.116, E29.267, E29.268, 257/E21.619, E21.634; 438/161, 666, 533, 438/570, FOR. 191

See application file for complete search history.

(56) References Cited

U.S. PATENT DOCUMENTS

| | | | | |
|---|---|---|---|---|
| 5,612,565 A | * | 3/1997 | Kusumoto | ................... 257/401 |
| 6,593,977 B2 | * | 7/2003 | Ishihara et al. | ................ 349/43 |
| 7,608,857 B2 | * | 10/2009 | Fujimori et al. | ................ 257/64 |
| 2005/0058840 A1 | * | 3/2005 | Toyoda | ....................... 428/428 |

(Continued)

FOREIGN PATENT DOCUMENTS

JP 2001-278874 10/2001

(Continued)

OTHER PUBLICATIONS

Vikram C. Sundar, et al.; Elastomeric Transistor Stamps: Reversible Probing of Charge Transport in Organic Crystals; Science www.sciencemag.org ; Mar. 12, 2004; pp. 1644-1646; vol. 303.

(Continued)

*Primary Examiner*—Matthew Smith
*Assistant Examiner*—Quovaunda Jefferson
(74) *Attorney, Agent, or Firm*—Antonelli, Terry, Stout & Kraus, LLP.

(57) ABSTRACT

A manufacturing method of a field effect transistor in which, a patterned gate electrode is provided on a substrate, and a gate insulator is provided on the substrate and the gate electrode, a source electrode and a drain electrode are spaced apart from each other on the gate insulator, a region to be a channel between the source electrode and the drain electrode is provided, a boundary between the region and either one of the source electrode and the drain electrode is linear, a boundary between the region and either one of the drain electrode and the source electrode is non-linear, the boundary has a continuous or discontinuous shape, and the boundary part has a plurality of recess parts, the surface of the region has hydrophilicity and a peripheral region of the region prepares a member having water-repellency, and a solution including semiconductor organic molecules is supplied to the region, and the solution is dried.

19 Claims, 6 Drawing Sheets

U.S. PATENT DOCUMENTS

| | | | | |
|---|---|---|---|---|
| 2006/0220020 A1* | 10/2006 | Hwang | | 257/59 |
| 2007/0152210 A1* | 7/2007 | Han et al. | | 257/40 |
| 2009/0109364 A1* | 4/2009 | Yang et al. | | 349/46 |

FOREIGN PATENT DOCUMENTS

| | | |
|---|---|---|
| JP | 2003-080694 | 3/2003 |
| JP | 2003-133691 | 5/2003 |
| JP | 2003-229579 | 8/2003 |
| JP | 2004-119479 | 4/2004 |

OTHER PUBLICATIONS

Oana D. Jurchescu, et al.; Effect of impurities on the mobility of single crystal pentacene; Applied Physics Letters; Apr. 19, 2004; pp. 3061-3063; vol. 84, No. 16.

A. R. Brown, et al.; Precursor route pentacene metal-insulator-semiconductor field-effect transistors; J. Appl. Phys.; Feb. 15, 1996; pp. 2136-2138; vol. 79, No. 4.

Ali Afzali, et al.; High-Performance, Solution-Processed Organic Thin Film Transistors from a Novel Pentacene Precursor; J. Am. Chem. Soc; 2002; pp. 8812-8813; vol. 124; No. 30.

Takashi Minakata, et al.; Direct Formation of Pentacene Thin Films by Solution Process; Synthetic Metals; 2005; pp. 1-4; vol. 153.

Mika Nagano, et al.; The First Observation of $^1$H-NMR Spectrum of Pentacene; Japanese Journal of Applied Physics; Feb. 6, 2004; pp. L315-L316; vol. 43, No. 2B.

Nikkei Electronics; Leading Trends; Jun. 17, 2002; pp. 67-78.

* cited by examiner

FIELD EFFECT TRANSISTOR AND MANUFACTURING METHOD THEREOF

CROSS-REFERENCE TO RELATED APPLICATION

The present application claims priority from Japanese Patent Application No. JP 2006-121540 filed on Apr. 26, 2006, the content of which is hereby incorporated by reference into this application.

TECHNICAL FIELD OF THE INVENTION

The present invention relates to a field effect transistor and manufacturing method thereof, and especially to a field effect transistor in which an organic semiconductor to form a channel is a single crystal or a polycrystal of an organic molecule, and having a structure in which the orientation of the single crystal is facing to a specific direction to the direction connecting electrodes at both channel ends or having a structure in which a crystal grain comprising the polycrystal is oriented in the specific direction connecting electrodes at both channel ends.

BACKGROUND OF THE INVENTION

A plasma display panel (PDP) and a liquid crystal display (LCD), which are typical flat or thin type display devices, do not use an electron gun as used in a cathode-ray tube display. Instead of this, because they use thin film transistors (TFTs) as a switching element to illuminate each pixel, a substantial reduction in thickness of the device has been realized. An element using amorphous silicon or polycrystalline silicon in the channel is used in the TFT.

Organic EL (Electro Luminescence) devices are noted as an element for a next generation display in which disadvantages in the expected life span, contrast, responsiveness, power consumption, etc. possessed by the PDP and the LCD can be improved, and research to put the organic EL device to practical use has been in progress. Further, the organic EL device is a thin film device of organic materials, and still further reduction in thickness than the PDP and the LCD is in progress. Furthermore, because the organic materials, having a light weight and flexibility, are used as raw materials, realization of a wall-mounted display and a flexible display is considered to be possible. In order to make use of such advantages, research has been performed actively to make a TFT with the organic materials having a light weight and flexibility, for driving an organic EL device.

Because the organic materials are dissolved in an organic solvents, etc. and can be handled at around room temperature, it is expected that the manufacture of the organic TFTs also uses the solution and it can be manufactured with a process of coating and printing. In the manufacture by coating and printing, vacuum equipment, thermal processes at high temperature, etc., which are essential in a silicon device, are not necessary, and a substantial reduction in manufacturing cost can be realized. On the other hand, the performance of the organic TFT as a transistor is substantially inferior compared to the silicon device, and it has not come to practical use in the present condition.

Organic molecules are roughly classified into organic molecules with a small molecular weight (a low molecule) such as a monomer and an oligomer, and organic molecules with a large molecular weight categorized as a polymer, and the organic TFTs are also classified into two kinds depending on with which organic molecules the channel is formed. In the organic TFTs using low molecules in the channel, it is proved that mobility of the carriers flowing in the channel can be increased to at least the same level as amorphous silicon if crystallinity of the organic molecular crystal can be kept favorably, and it has an advantage that the TFT with a high operation speed is easily obtained. However, the method of forming which uses vacuum deposition of organic molecules is a general method for the formation of the channel, and has a disadvantage that it is difficult to reduce the manufacturing cost. On the other hand, because the organic TFTs using polymers in the channel are easy to apply a coating and a printing process in the manufacture, the manufacturing cost can be reduced. However, the mobility of the carriers flowing in the channel that has been realized is only about $\frac{1}{10}$ at most compared to the low molecule organic TFTs using low molecules in the channel, and it has a disadvantage that the performances of the TFTs are low.

In the organic TFT, there is a problem that the operation speed of the TFT is low compared to a silicon-based TFT in general. This is because the mobility of the carriers flowing in the channel is small, and scattering of the carriers in the channel is known to be one of the big causes. In order to reduce the scattering of the carriers, making the crystal grains of the crystals forming the channel large and reducing the number of crystal grain boundaries that the carriers pass when contacting in the channel are performed widely in the low molecules. To use a single crystal in the channel is the most desirable because influence of the grain boundaries can be eliminated. In the case of the polymers, by extending the polymers as much as possible in the direction parallel to the carriers flowing in the channel, the carriers scattering in the polymers are reduced in general.

In order to realize a display device with flexibility, in addition to the TFT for the pixel driving switch, it is necessary to make a peripheral circuit also has flexibility. A TFT used in a pixel driving circuit having larger carrier mobility than about 1 (cm$^2$/V·s) is required. However, the organic TFT that has proved to satisfy this requirement in the present condition is only the TFT in which organic molecules with a small molecular weight is used in the channel. For example, in Science, Vol. 303, p. 1644 (2004), a carrier mobility of 15 (cm$^2$/V·s) is obtained in the organic TFT using a single crystal of an organic molecule, rubrene, in the channel. Further, in Applied Physics Letters, 84, 3061 (2004), a carrier mobility of 35 (cm$^2$/V·s) at room temperature is reported for a single crystal of the highly purified organic molecule, pentacene. However, such high mobility is for a single crystal sample, and is obtained by paying special attention to refining of organic material as raw material, single crystal growth, and manufacture of the TFT. With thin film crystals of organic molecules formed with vacuum deposition that is a general method in the case of using low molecules in the channel, it is difficult to form a single crystal in the channel. Further, because vacuum equipment is used in the manufacture of the TFTs, it is disadvantageous in the aspect of cost and mass production.

In such a way, the organic TFTs have a problem that the performance required from the application side and cost and mass production required in the aspect of production cannot be fulfilled at the same time. That is, a vacuum deposition process is generally used in the manufacture of the organic TFTs consisting of low molecules in which the performance of the TFTs can be easily improved, and it is disadvantageous in the aspect of manufacturing. On the other hand, for the organic TFTs consisting of polymers in which the manufacturing cost can be easily reduced, the performances of the TFTs are extremely low and it is applicable only for limited use.

As a method to solve such problem, there is a method of forming a semiconductor layer of the channel by dissolving low molecules into a solvent and coating. Examples of pentacene that is the most typical organic molecule as an application example to the TFTs of low molecules are disclosed in Journal of Applied Physics, Vol. 79, p. 2136 (1996) and Journal of American Chemical Society, Vol. 124, p. 8812 (2002), in which technology is reported of synthesizing a precursor of a pentacene molecule and forming a thin film using a solution in which solubility to a solvent is improved. Further, in Synthetic Metals, Vol. 153, p. 1 (2005), there is a description about technology of forming a thin film by dissolving pentacene molecules directly into solvents and coating. Furthermore, also in Applied Physics Letters, Vol. 84, p. 3061 (2004) and Japanese Journal of Applied Physics, Vol. 43, No. 2B, p. L315 (2004), there is a description about a procedure to dissolve pentacene molecules into an organic solvent. With these technologies, a low molecular organic thin film can be formed by coating without using vacuum equipment, and the possibility of realizing the required performance with a low cost arises.

The problem is described briefly as follows.

FIG. 1A shows a plan view of the field effect transistor according to an embodiment of the present invention. A lyophobic region 14 is provided on a substrate 16, a source $15_1$ and a drain $15_2$ are provided inside of it, a part to be a channel (a lyophilic region) 12 is provided between them, and by supplying a solution containing semiconductor organic molecules on region 12 and drying it, a channel is formed.

In this embodiment, a recess part 20 is provided.

Examined by the inventors, it was found that the drying direction of the solution cannot be controlled in the case that the recess 20 is not provided (the boundary between the source $15_1$ and the region 12 is made to be linear).

Because of this, a characteristic variation among the TFTs occurs. Therefore, there is a problem that it is difficult to improve not only the device characteristics of the TFTs and uniformity of characteristics among the TFT devices, but also its reliability.

However, not all problems are solved with the above-described coating technology. That is, in the case of forming the channel semiconductor layer of the TFT by coating, it is necessary to limit the region where the semiconductor is formed to the channel. However, only the conventional technology described in Journal of Applied Physics, Vol. 79, p. 2136 (1996), Journal of American Chemical Society, Vol. 124, p. 8812 (2002), and Synthetic Metals, Vol. 153, p. 1 (2005) cannot satisfy the necessity. The technology using a lyophilic and lyophobic pattern as in Japanese Patent Application Laid-Open Publication No. 2004-119479 for example can be applied as a method of limiting the semiconductor layer forming region. Using this technology, the lyophilic and lyophobic pattern is formed on the surface where the solution is being dropped, and the semiconductor layer forming region can be limited by confining the solution within the lyophilic pattern. However, such a technology cannot solve following problems. That is, even though the dropped solution is limited in the lyophilic pattern, the drying direction of the solution cannot be controlled. Because of this, the semiconductor crystals produced after drying are oriented randomly in each channel. Therefore, characteristic variations among TFTs are generated. Depending on the case, for example in the case where the semiconductor concentration of the solution is low, semiconductor films are formed only on a part inside the lyophilic patterns, and there is a possibility that its positions are distributed randomly among the TFTs. The cause of this problem is that at which part of the lyophilic pattern the dropped solution starts to dry, to which direction the drying proceeds, and in which position it dries finally cannot be controlled. That is, this is because the position of the organic semiconductor crystal film formed after drying is determined randomly in each TFT. This exhibits more obviously in the case of increasing the drying speed by heating the substrate and in the case of heating the solution to increase solubility. Furthermore, the size and the orientation of the semiconductor crystal grains formed cannot be controlled. Therefore, it is difficult to improve not only the device characteristics of the TFTs and uniformity of characteristics among the TFT devices, but also reliability.

The present invention is made in view of the above-described problems.

SUMMARY OF THE INVENTION

An outline of the embodiment of the present invention is described as follows.

As shown in FIG. 1A, for example the recess part 20 is provided for example on the boundary line of the source $15_1$ and the part to be a channel region (a lyophilic region) 12. With this, the drying direction of the solution is controlled. Then, the drying proceeds first from the side on the boundary line between the drain $15_2$ and the part to be a channel region (a lyophilic region) 12, and the drying proceeds as shown in FIGS. 3A to 3E. Thereby, as shown in FIG. 1A, a crystal grain 11 to be a channel is oriented in an elongated shape to the direction where the source $15_1$ and the drain $15_2$ exist in the extended direction. With this, the problem of the conventional technology can be solved.

One of the points of the present invention is as follows.

A manufacturing method of a field effect transistor, comprising steps of providing a patterned gate electrode on a substrate, and providing a gate insulator on the above-described substrate and the above-described gate electrode, providing a source electrode and a drain electrode spaced apart from each other on the gate insulator, providing a region that is to be a channel between the source electrode and the drain electrode, a first boundary between the region and either one of the source electrode and the drain electrode is linear, a second boundary between the region and either one of the source electrode and the drain electrode is non-linear, the second boundary is continuous or discontinuous, and the boundary part has a plurality of recess parts, the surface of the region has higher hydrophilicity than the other regions, and the periphery of the region is provided with a member having higher water-repellency than the region, and supplying a solution including semiconductor organic molecules to the region and drying the solution.

The present invention is to solve the above-described problem by giving a characteristic to the pattern shape on a part of the semiconductor layer forming region where the solution is dropped in which the semiconductor organic molecules are dissolved. The pattern on the semiconductor layer forming region is given by a lyophilic and lyophobicity and difference in level to the surface. This characteristic affects the shape of the dropped solution, and as a result, defines the positions where the drying of the solution starts and ends and controls the direction of the crystal growth of the semiconductor film to be formed. As a result, a channel layer can be obtained in which a specific crystal orientation is orientated to the conducting direction of the carriers flowing in the channel or the size of the crystal grains grow large in the above-described carrier moving direction.

In the case of referring to lyophilicity and lyophobicity to liquid of the surface in the present specification, these physical characteristics are considered to be limited as follows. That is, the surface having a lyophobicity is the surface in which the contact angle to the surface of the liquid used is about 70° or more and the surface having lyophilicity is the surface in which the contact angle to the surface of the liquid used as the same is about 40° or less.

The characteristic given to the pattern may be for example a rectangular lyophilic region added to a part of the channel region as shown in FIG. 1A. Because the liquid dropped on the solid surface forms a shape such that free energy of a system in which solid and liquid are combined becomes minimum and the lyophilic region has a high surface energy, the solution dropped on the lyophilic region lowers the energy of the system by coating the surface of the lyophilic region having a high surface energy and exposing the liquid surface of the solution of which the surface energy is relatively low, and thereby the energy of the system is lowered. That is, the solution spreads in the region as it wets the lyophilic region. The drying occurs on the entire liquid surface and the volume of the solution decreases. However, because the continuation of wetting the rectangular lyophilic region added to the lyophilic pattern is more beneficial in terms of energy, the solution moves to the side where the rectangular lyophilic region is added as being dried, and the drying proceeds from the opposite side, the side in which there is no lyophilic region. That is, the drying direction can be controlled by the position of the rectangular lyophilic region. Because the crystals grow in the direction where the boundary face of the solution and the surface is scanning, the crystals oriented in the above-described scanning direction can be grown. Further, because the crystal grains grow in this direction, the size of the crystal grains can be grown large in this direction.

The characteristic given to the pattern is described to be a rectangular lyophilic region here because it was explained with FIG. 1 as an example. However, it is not necessary to be rectangular and may be a triangle, a part of circle, a wave shape, a combination of these, as shown in FIGS. 2A to 2H, or any other shapes as long as by giving a change to a part of the linear source/drain electrode—channel boundary so that the channel area increases, and thereby the symmetry of whatever the channel shape before giving a change is lowered and it affects the free energy of the solution—solid surface and produces the above-described effect. Further, there is also a method of giving such a non-linear change only to either one of the boundaries on both sides as shown in FIGS. 3E to 3H, but not either one of boundaries of the channel and the source electrode or the drain electrode as shown in FIGS. 3A to 3D.

It is possible to control the drying direction of the solution depending on the position where the change is given. As to L1 in FIG. 2, the characteristic size of the given non-linear shape may be about 5 to 10% of the channel length which is the characteristic size of the channel. If the size is 10% or more, there is specifically no problem in controlling the drying direction. However, it is necessary to keep to the level that there is no bad effect on the performance of the transistor. For $L_2$, there is no problem if is it about the same size as $L_1$. In the embodiment described later, the channel length L and the channel width W are several 100 s μm and several 10 s μm respectively, and the size of $L_1$ and $L_2$ becomes about a few μm to several 10 s μm.

According to the embodiment of the present invention, by providing the above-described recess part in the boundary part of the source/drain and the region to be a channel, the drying of the semiconductor organic molecule solution to a plurality of TFT elements can be controlled. As a result, it is possible to control the growth direction and the orientation of the crystal grains forming an organic molecule crystal thin film grown from the solution. With this, the mobility of the carriers flowing in the channel can be improved, and the variations among the TFTs are decreased, and the reliability can be improved. In the case of growing the semiconductor organic molecule crystals from liquid, it is necessary to control the drying step of the solution in which the semiconductor organic molecules are dissolved in order to realize the control of the orientation of the crystals and the growth direction at a low price, and it is the most realistic to use the pattern given on the substrate (for example, the above-described recess part) in order to achieve this objective at a low price. With this method, a plurality of the organic TFTs with a large carrier mobility can be formed on the same substrate at a low price and easily using a printing method including a coating method and an inkjet method.

According to the present invention, the carrier mobility of the organic TFTs can be larger than the conventional organic TFTs.

BRIEF DESCRIPTIONS OF THE DRAWINGS

DESCRIPTIONS OF THE PREFERRED EMBODIMENTS

Embodiment 1

Figure 1A:
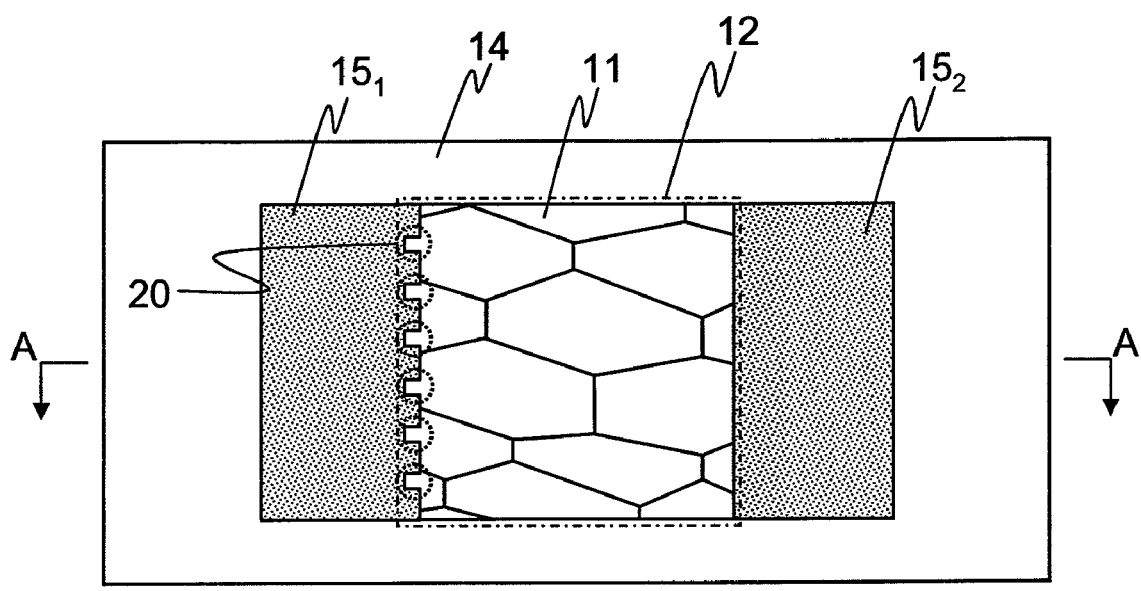
FIG. 1A is a plan view showing a typical structure of a TFT formed by an embodiment of the present invention.
Figure 1B:
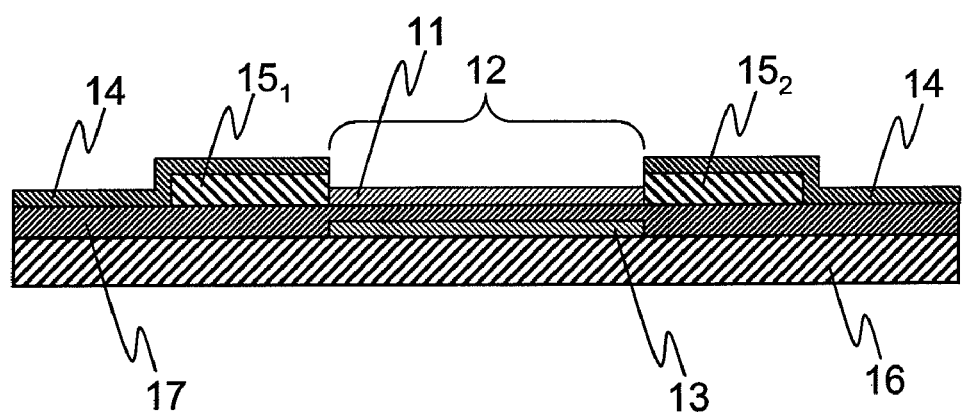
FIG. 1B is a cross section viewing in the arrow direction at the A-A position of FIG. 1A.
Figure 2A:
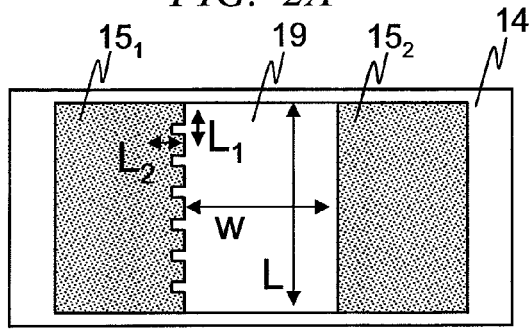
FIG. 2A is a diagram schematically showing an example of non-linear shape given to the source/drain electrode and channel boundary of the TFT formed by the embodiment of the present invention.
Figure 2E:
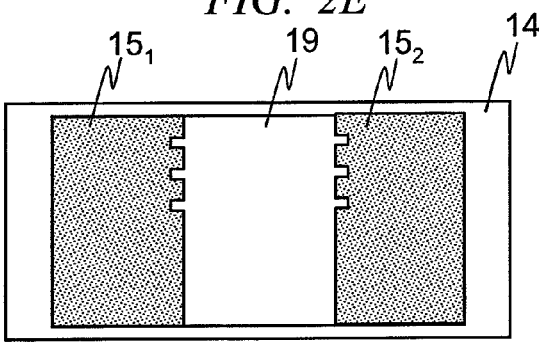
FIG. 2E is a diagram schematically showing an example of non-linear shape given to the source/drain electrode and channel boundary of the TFT formed by the embodiment of the present invention.
Figure 2B:
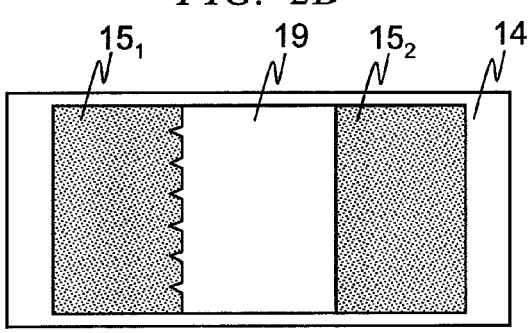
FIG. 2B is a diagram schematically showing an example of non-linear shape given to the source/drain electrode and channel boundary of the TFT formed by the embodiment of the present invention.
Figure 2F:
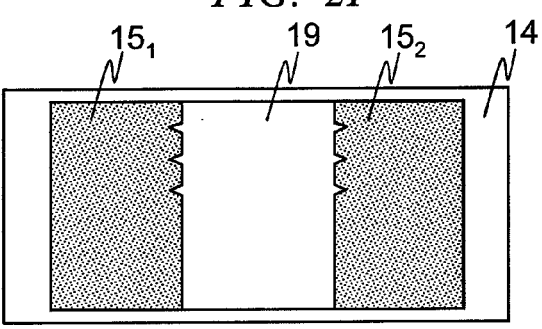
FIG. 2F is a diagram schematically showing an example of non-linear shape given to the source/drain electrode and channel boundary of the TFT formed by the embodiment of the present invention.
Figure 2C:
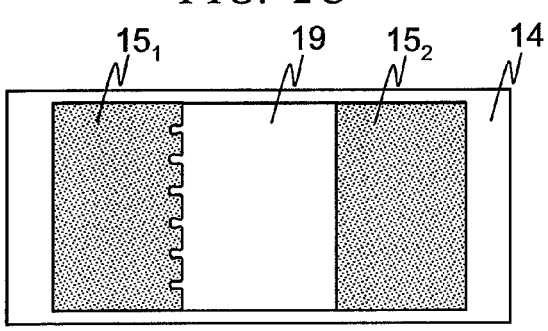
FIG. 2C is a diagram schematically showing an example of non-linear shape given to the source/drain electrode and channel boundary of the TFT formed by the embodiment of the present invention.
Figure 2G:
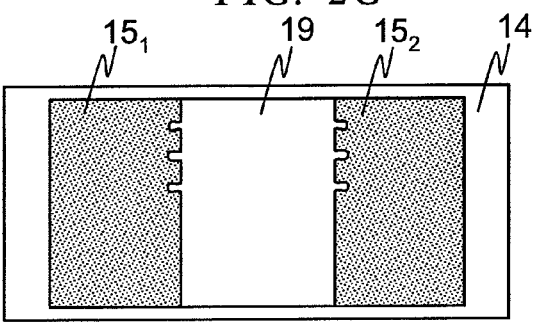
FIG. 2G is a diagram schematically showing an example of non-linear shape given to the source/drain electrode and channel boundary of the TFT formed by the embodiment of the present invention; and, FIG. 2H is a diagram schematically showing an example of non-linear shape given to the source/drain electrode and channel boundary of the TFT formed by the embodiment of the present invention.
Figure 2D:
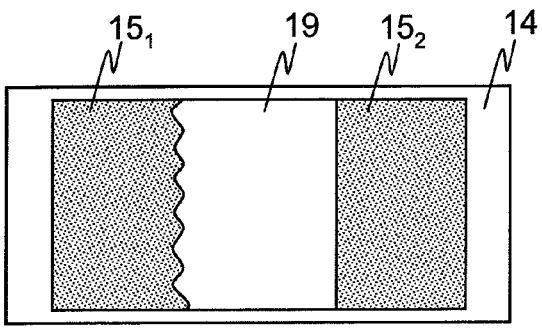
FIG. 2D is a diagram schematically showing an example of non-linear shape given to the source/drain electrode and channel boundary of the TFT formed by the embodiment of the present invention.
Figure 2H:
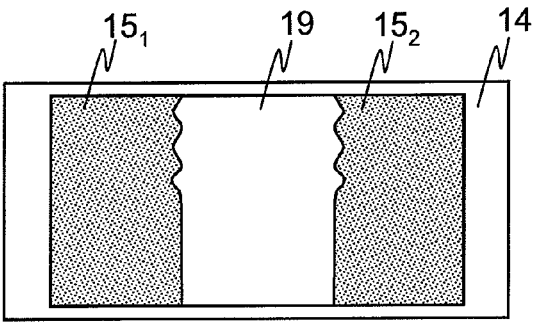

FIG. 1A is a plan view schematically showing a structure of the TET according to Embodiment 1 in the present invention. FIG. 1B shows a cross-section at the A-A position.

In FIG. 1A, $15_1$ and $15_2$ are source/drain electrodes respectively. 11 is a semiconductor organic molecule crystal thin film, consisting of highly oriented crystal grains, and forming a channel region 12 of the TFT. 14 is a region where lyophobicity is high and its surface is in the lyophilic state (the lyophobicity is low). As described later, the present invention is made to control the orientation and the crystal grain size of the growing crystals by defining the drying direction of the semiconductor organic molecule solution supplied to the lyophilic region 12 using a pattern of the lyophilic region 12 in the region surrounded by the lyophobic region 14.

In FIG. 1B, 16 is a substrate. After a gate electrode 13 is formed on its top face, and an insulator 17 is formed. The lyophobic region 14 explained in FIG. 1A and the lyophilic region 12 are formed on the insulator 17. This lyophilic region 12 is positioned and self-aligned so that it becomes a position corresponding to the gate electrode 13. Using the lyophilicity of the surface of the channel region, after forming the semiconductor organic molecule thin film oriented to the channel 12, the source/drain electrodes $15_1$ and $15_2$ are formed. The process procedure described here is explained later more specifically.

The present invention has a characteristic in the point that the recess part 20 as shown in FIG. 1A is provided in at least a part of the boundary between either one of the source region or electrode $15_1$ or the drain region or electrode $15_2$ and the region to be the channel (lyophilic region) 12. In FIG. 1A, a plane shape of the recess part is a rectangle (a square). However, the plane shape is not limited to a rectangle, and at least any one of a triangle, a semicircle, a square (including a regular square and a rectangle), and a wave shape.

In the case of the present embodiment, it is important that the shape of the boundary (line) of the source region $15_1$ and the lyophilic region 12 and the shape of the boundary (line) of the drain electrode $15_2$ and the lyophilic region 12 are different from each other. In such a way, by providing for example a recess part in a part of the outer periphery without the outer peripheral shape of the lyophilic region 12 being a simple rectangle, the same anisotropy occurs in the stability to the distribution of the liquid dropped in the lyophilic region, and the movement of the liquid occurs as to realize such distribution in the drying step. As a result, the anisotropy of the drying direction and the starting and the ending positions of drying can be determined regularly.

Moreover, as described above, if the drying direction of the solution in the lyophilic region and the starting and the ending positions of drying can be controlled, the shape of the recess part may be an arbitrary shape as described above.

FIGS. 3A to 3E are diagrams explaining the anisotropic drying process of the solution including the semiconductor organic molecules and the growth process of the highly oriented crystals in the present invention. Here, the word "anisotropic" has a meaning the opposite of isotropic. It refers to the state where the drying direction of the solution is not isotropic, or where it is not disordered but controlled.

Figure 3A:
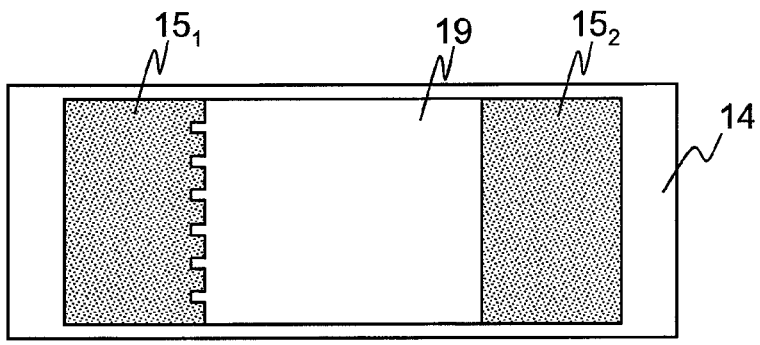
FIG. 3A is a diagram schematically showing a step of a highly oriented semiconductor organic molecule crystal thin film grown from a solution by voluntarily causing anisotropic drying of the semiconductor organic molecule solution in the embodiment of the present invention.

As shown in FIG. 3A, the member is prepared in which the lyophilic region 19 to form a TFT pattern is surrounded by the lyophobic region 14. At both ends of the lyophilic region 19, a source electrode part and a drain electrode part are formed, and the channel 12 is formed between them. It is desirable that the lyophobicity is given also to the source/drain electrode parts. The lyophobicity is given to the surface of the electrodes for example by the formation of a lyophobic monomolecule layer that absorbs selectively on the surface of the source/drain electrodes. Specifically, using gold, silver, platinum, etc. as the electrode, various molecules having thiol selectively absorbing these metals at the ends can be used.

Figure 3B:
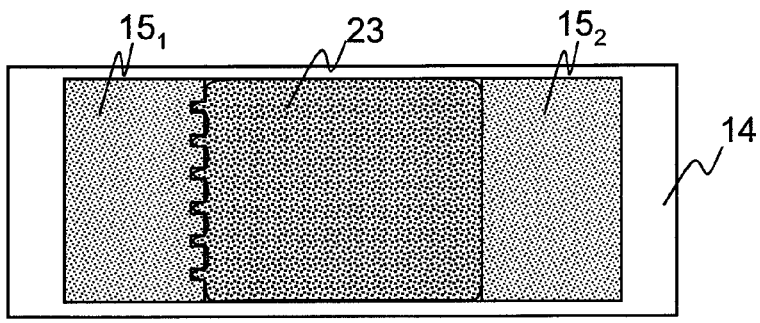
FIG. 3B is a diagram schematically showing a step of the highly oriented semiconductor organic molecule crystal thin film grown from the solution by voluntarily causing anisotropic drying of the semiconductor organic molecule solution in the embodiment of the present invention.

As shown in FIG. 3B, a solution 23 in which the semiconductor organic molecules are dissolved is supplied to this lyophilic region 10 using a liquid dispensing mechanism. It is desirable to keep the substrate horizontal so that the supplied solution does not bulge out of the lyophilic region. It is desirable to manufacture the member so that the surface of this lyophilic region 19 also becomes horizontal by keeping the member horizontal. Examples of the liquid dispensing mechanism may include one having a hole of a small diameter opened at the end such as a dropper and a micro-pipette and an ink dispensing head of a dispenser and an inkjet printer using a needle made from metal. It is desirable that the liquid dispensing mechanism has the mechanism to control the dispensing position and the mechanism to control the dispensing amount of the solution to be dispensed. Depending on the solvent used and the difference in the lyophobicity of the lyophobic region and the lyophilic region, the solution can be supplied on the substrate by soaking the entire substrate into the solution without using the liquid dispensing mechanism. The supplied solution 23 remains in the lyophilic region 19 because the peripheral part of the lyophilic region 19 is surrounded by the lyophobicity. The lyophobic region 14 and the lyophilic region 19 may be formed with a known method. For example, after coating the entire surface with the organic molecule solution having the lyophobicity, by irradiating ultraviolet rays using a mask having a desired pattern, the lyophobic organic molecules only in the irradiated region are decomposed and the patterning can be performed. Further, as in Japanese Patent Laid-open Publication No. 2001-278874, there is a method of forming a lyophobic pattern by applying the lyophobic solution with a liquid dispensing mechanism, etc. In addition to the lyophilic patterning, it is preferable to process the peripheral part into a lyophobic region as providing a difference in level so that the lyophilic region 19 is lower than the peripheral part.

Figure 3C:
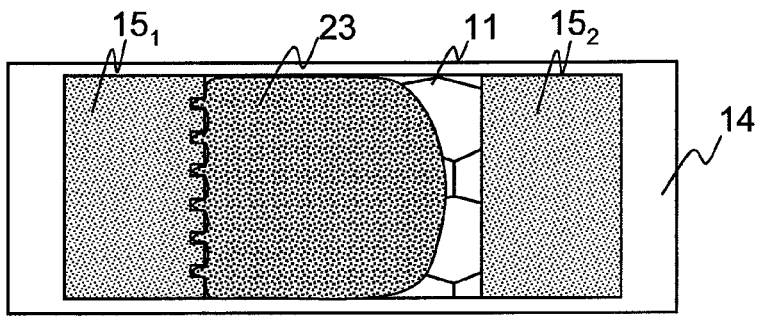
FIG. 3C is a diagram schematically showing a step of the highly oriented semiconductor organic molecule crystal thin film grown from the solution by voluntarily causing anisotropic drying of the semiconductor organic molecule solution in the embodiment of the present invention.

The drying of the solution 23 supplied on the lyophilic region 19 occurs on the entire face where liquid and gas are contacting with each other. However, as shown in FIG. 3C, the liquid amount decreases from the side where there is no recess part and the liquid remaining on the side where the recess part is added becomes relatively large. This is because the solution changes its distribution so that the free energy of the system consisting of the surface of the lyophilic region and the liquid becomes minimum, and moves to the area where there is the recess part. In the case of the lyophilic region having no recess part and having a shape with higher symmetry, because the movement of the liquid does not bring a change in the gain of the energy, the liquid moves in an indefinite direction in the drying process, and the position where the drying starts is determined irregularly. On the other hand, in the case that there is the recess part, because the gain of the free energy is large when this region is wet, the remaining liquid moves voluntarily to the area where there is the recess part, and the drying starts from the area where there is no recess part. Therefore, the direction of drying and the start and the end of drying can be controlled stably. Because the crystal of the semiconductor organic molecule grows with the drying of the solution, the crystal grows from the area where there is no recess part toward the area where there is the recess part. It is necessary to position the recess part in any other places in the channel so that the drying starts from the one side of the lyophilic pattern and voluntarily reaches to the other side.

Figure 3D:
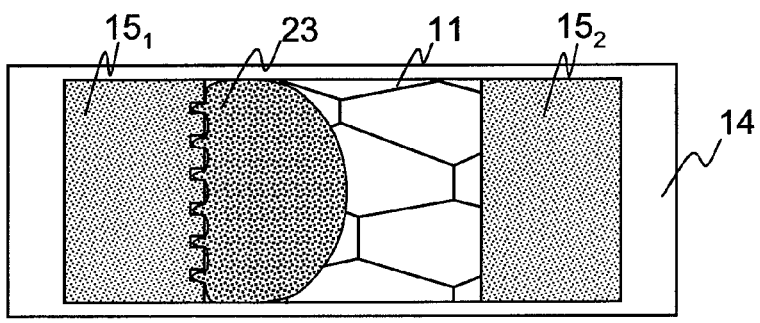
FIG. 3D is a diagram schematically showing a step of the highly oriented semiconductor organic molecule crystal thin film grown from the solution by voluntarily causing anisotropic drying of the semiconductor organic molecule solution in the embodiment of the present invention.
Figure 3E:
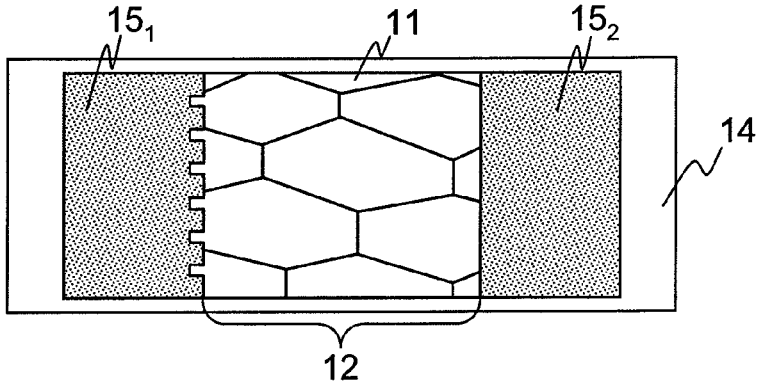
FIG. 3E is a diagram schematically showing a step of the highly oriented semiconductor organic molecule crystal thin film grown from the solution by voluntarily causing anisotropic drying of the semiconductor organic molecule solution in the embodiment of the present invention.

As shown in FIG. 3D, the solution 23 dries from one side of the channel to the other side, and as the result, the semiconductor organic molecules 11 dissolved in the solution 23 grows in the channel 12 oriented parallel to the proceeding direction of the drying of the solution. That is, it is possible to arrange the semiconductor organic molecule crystal 11 in which the diameter of the crystal grain grows larger in the longitudinal direction of the channel 12 (the direction connecting the source and the drain), and the specific crystal orientation is matched to its direction.

Embodiment 2

In the present embodiment, a method of constructing the TFT of the present invention is explained using a material having flexibility and with a method such as printing and coating without depending on lithography. FIGS. 4A to 4F are figures specifically explaining the constructing method. Each figure on the left side of FIGS. 4A, 4B, 4D, and 4F shows B-B' cross-section of the figure on the right side respectively.

Figure 4A:
FIG. 4A is a diagram showing a specific example of forming the TFT using a printing and coating method by an embodiment of the present invention.
Figure 4A:
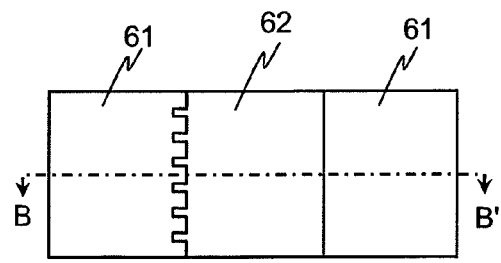
Figure 4B:
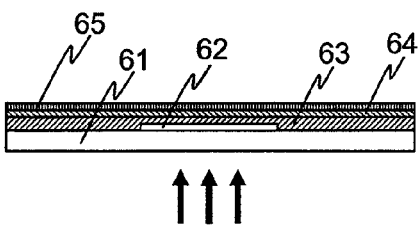
FIG. 4B is a diagram showing a specific example of forming the TFT using a printing and coating method by the embodiment of the present invention.
Figure 4B:
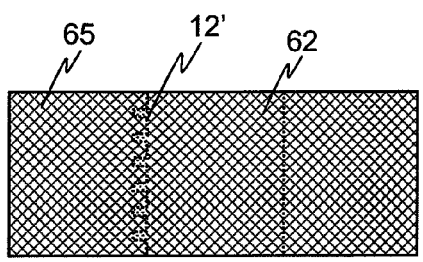

As shown in FIG. 4A, a gate electrode 62 with a pattern shown in FIG. 1 is printed on a plastic substrate 61 using a conductive ink. A gate or metal electrode 62 is formed by baking it. However, because plastic is used in the substrate, caution must be paid to its softening temperature. In Embodiment 2, a high heat resistance and high transparency polyimide sheet of 100 μm thickness is used in the substrate 61, and the baking temperature can be raised up to about 250° C. Because of this, in the case of using a silver ultrafine particle dispersion liquid for the conductive ink, it can sufficiently withstand the necessary baking temperature of 200° C.

The substrate 61 and the gate electrode 62 are spin-coated with polymethylmethacrylate (PMMA), dried sufficiently, and a gate insulator 63 is formed. Here, the drying is performed for 10 minutes at 100° C. using a hot plate. Furthermore, a photosensitive thin film 64 is formed. In Embodiment 2, it is spin-coated with a positive resist, and a film of 100 nm thickness is obtained.

Figure 4C:
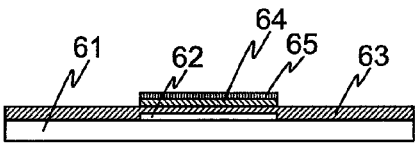
FIG. 4C is a diagram showing a specific example of forming the TFT using a printing and coating method by the embodiment of the present invention.
Figure 4D:
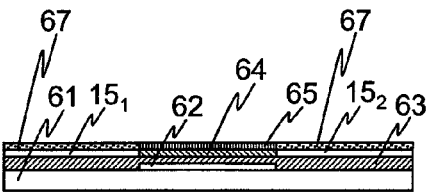
FIG. 4D is a diagram showing a specific example of forming the TFT using a printing and coating method by the embodiment of the present invention.
Figure 4D:
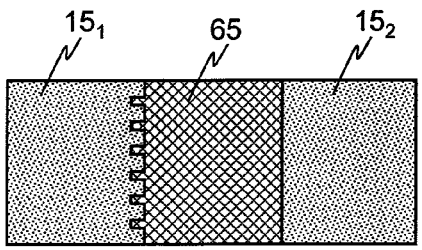
Figure 4E:
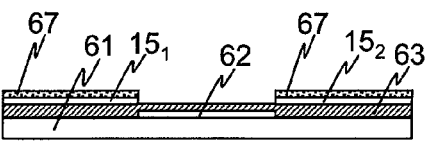
FIG. 4E is a diagram showing a specific example of forming the TFT using a printing and coating method by the embodiment of the present invention.
Figure 4F:
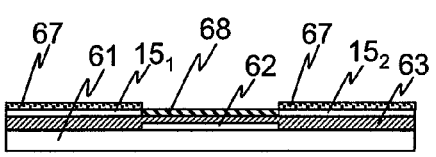
FIG. 4F is a diagram showing a specific example of forming the TFT using a printing and coating method by the embodiment of the present invention.
Figure 4F:
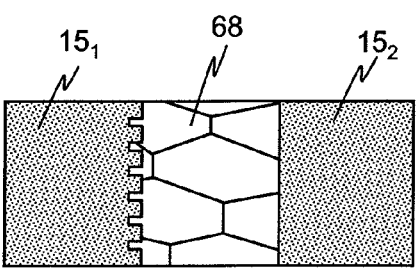

Next, a lyophobic pattern is formed to form the source/drain electrodes. It is spin-coated with an alkyl fluoride silane coupling agent (trade name: Optool, manufactured by Daikin Industries, Ltd.) diluted to 0.1 wt % with perfluoro-octane as a lyophobic film, and an ultraviolet ray is applied with a mercury lamp from the face of the plastic substrate 61 as shown with an up arrow in the FIG. 4B cross section. Because the ultra-violet ray necessary for exposure of the photosensitive coating film used in Embodiment 2 is an i-line of 365 nm wavelength, in order to avoid a damage to the layered gate insulator 63 (a polymer film—a PMMA film), it is desirable to apply the ultraviolet ray of 300 nm wavelength or less by blocking with a filter. Because the metal electrode film 62 has already formed in the gate electrode part, the applied ultraviolet ray cannot penetrate the region corresponding to the channel 12, and the photosensitive thin film only on the region corresponding to the water-repellent region 14 of the gate electrode part and the source/drain electrode parts is exposed. After about 30 seconds of irradiation, the photosensitive thin film 64 of the region corresponding to the water-repellent region 14 of the gate electrode part and the source/drain electrode parts is removed by developing the photosensitive thin film, and the water-repellent film of its region is lifted off. In this way, the water-repellent film 65 is formed in the region corresponding to the channel (FIG. 4C). The metal films 15$_1$ and 15$_2$ to be source/drain electrodes are formed using the conductive ink in the same manner as the gate electrode (FIG. 6D). A lyophobic film 67 is formed by spin-coating with the alkyl fluoride silane coupling agent the same as described above (FIG. 6D). By removing the resist 64 using a solvent of the photosensitive thin film, the water-repellent film 65 of the channel region is lifted off, and only the region 67 corresponding to the region besides the channel, that is the source/drain electrode parts, expresses the lyophobicity. In the present embodiment, acetone is used as the photosensitive thin film solvent.

Next, in order to form the channel, the semiconductor organic molecules are coated. Using a dispensing tool with a nozzle position control mechanism, a solution dispensing amount control mechanism, and a solution heating mechanism, the solution of the semiconductor organic molecules is supplied to the channel under a nitrogen environment. In Embodiment 2, as described in Synthetic Metals, 153, 1 (2005), a solution is used in which pentacene is dispersed at 0.1 wt % in trichlorobenzene as a solvent, heated to 200° C., and dissolved. This solution is supplied about 3 micro-liter through a nozzle. In order to prevent crystal growth in the solution due to a rapid decrease in the temperature of the solution, the substrate may be preferably heated to about 170° C. The supplied solution dries anisotropically toward the side where there is the recess part provided in the channel, and a semiconductor organic molecule thin film 68 oriented in the above-described direction is formed as shown in the top view of FIG. 4F (right-side FIG. in FIG. 4F). In this way, a semiconductor organic molecule layer or film 68 is formed in the hydrophilic region, and a TFT having flexibility can be consisted of an inexpensive method such as printing and coating without using lithography. Moreover, after forming the semiconductor organic molecule crystal film, in order to prevent oxidation of the semiconductor layer, it is desirable to place it under an environment of nitrogen gas or inert gas or to keep it in the state that light having a shorter wavelength than the visible light is not irradiated in a gas including oxygen.

In Embodiment 2, the gate electrode and the channel and the source/drain electrodes can be positioned and self-aligned by using a backside exposure.

In Embodiment 2, polyimide is used for the substrate, and PMMA is used for the insulator. However, besides this, there is no problem if various plastic substrates with flexibility including polyvinyl phenol are used for the substrate, and polyimide, polyvinyl phenol, etc. are used for the insulator. Further, in the case that flexibility is not necessary, by using an inorganic insulator for the substrate, an advantage can be gained that the selection of manufacturing processes such as printing and coating increases. After forming the gate electrode, the insulator is formed with a spin on glass (SOG), it is spin-coated with a positive resist, and an ultraviolet ray is irradiated from the backside using a mercury lamp. Because the resist except the region shaded by the gate electrode is dissolved and removed by developing, the resist pattern becomes the same pattern as the gate electrode. In this condition, it is spin-coated with the alkyl fluoride silane coupling agent. Continuously, the alkyl fluoride silane coupling agent is lifted off by removing the resist using acetone, etc., and the desired lyophobic pattern is obtained. In this method, because heat process of about 450° C. is necessary for the bakings of SOG and the organic solvent is used to remove the resist, this method cannot be used in the case of using an organic material in the substrate and others. This method has advantages that the number of manufacturing process steps is reduced and that metal is not necessary to form the lyophobic film.

Other Embodiments

In FIG. 1B, because a projected part added to the lyophilic pattern constructing the channel 12 is formed only on one side of the source/drain electrodes, the orientation direction of the semiconductor organic molecule crystals is oriented in the direction connecting the source/drain electrodes. However, the present invention is not limited to it. For example, by forming the added projected part in either one end of the upper side or the lower side of the both sides of the source and drain electrodes, the direction perpendicular to the direction in which the carrier is flowing in the channel can be made to be the main orientation direction of the crystals. In the same manner, it is possible to grow the crystals having the main orientation direction in an arbitrary direction to the carrier-conducting direction in the channel. Generally, because the crystal growth has a tendency of growing in an easy growth axis direction before other directions, the crystal grain grown from the solution also grows in the easy growth axis direction. Because of this, in the case that the easy growth axis and the crystal orientation in which the carrier mobility becomes maximum does not match, the easy growth axis can be controlled so that the crystal orientation in which the carrier mobility becomes maximum matches with the direction connecting the source/drain with the method described in the present embodiment.

It is not necessary that the shape of the recess part (projected part) is limited to a rectangle as shown in FIG. 1. It is good if the pattern is a pattern such that the solution supplied to the lyophilic region brings an anisotropical drying ending at the recess part. For this, the objective can be achieved even though it has a shape other than a rectangle such as a triangle, a semicircle, and other irregular shapes.

Further, the peripheral part is made to be the lyophobic region forming the region corresponding to the channel formed on the substrate lower than the peripheral part, the solution including organic molecules is supplied on the substrate, the above-described supplied solution is anisotropically dried in the direction controlled with the added projected part in a portion of the channel part, and the above-described organic molecules in the above-described solution may be oriented and grown in the region corresponding to the above-described channel.

Further, the supplement of the semiconductor organic molecule solution is not limited to the above-described method using a nozzle represented by a micro pipette, and a method using an inkjet printer as disclosed in Japanese Patent Application Laid-open Publication No. 2003-229579, Japanese Patent Application Laid-open Publication No. 2003-133691 and Japanese Patent Application Laid-open Publication No. 2003-80694 is applicable. Further, for example, a manufacturing method using what is called a direct drawing method such as an inkjet, plating, and printing as described in Nikkei Electronics (Jun. 17, 2002), pp. 67-78 has been actively studied in recent years, and by combining these technologies and the technology in the present invention, an advantage can be expected that an electronic circuit including electron devices can be formed at a lower cost compared to the conventional method using photolithography.

In Embodiment 2, an alkyl fluoride silane coupling agent is used as the lyophobic film material. However, other materials may be used as long as they are a lyophobic molecule having a carbon chain ended with a fluorine group in at least a part of it, and for example disclosed in Japanese Patent Application Laid-open Publication No. 2001-278874. An oxetane derivative such as perfluorooxetane having a fluorine substituent in the side chain may be used. Besides this, a lyophobic film that is not depending on a fluorine-based surfactant can be used. In this case, an advantage comes that the selection increases. However, there is a tendency that the lyophobicity to the semiconductor organic molecule solution decreases. Further, in Embodiment 2, after forming the source/drain electrodes, the above-described source/drain electrodes are coated with the alkyl fluoride silane coupling agent as a lyophobic film. However, by forming the electrode with gold using a gold ultrafine particle dispersion liquid in the formation of the source/drain electrodes, a thiol-based lyophobic film having a thiol group at the end can be used as the lyophobic film. In this case, there is an advantage that the contact resistance between the source/drain electrodes and the channel semiconductor film can be reduced.

Applied Embodiment

An example is shown of manufacturing a pixel unit of an active matrix type display element in which the TFT according to the Embodiment of the present invention is used in the driving circuit.

Figure 5A:
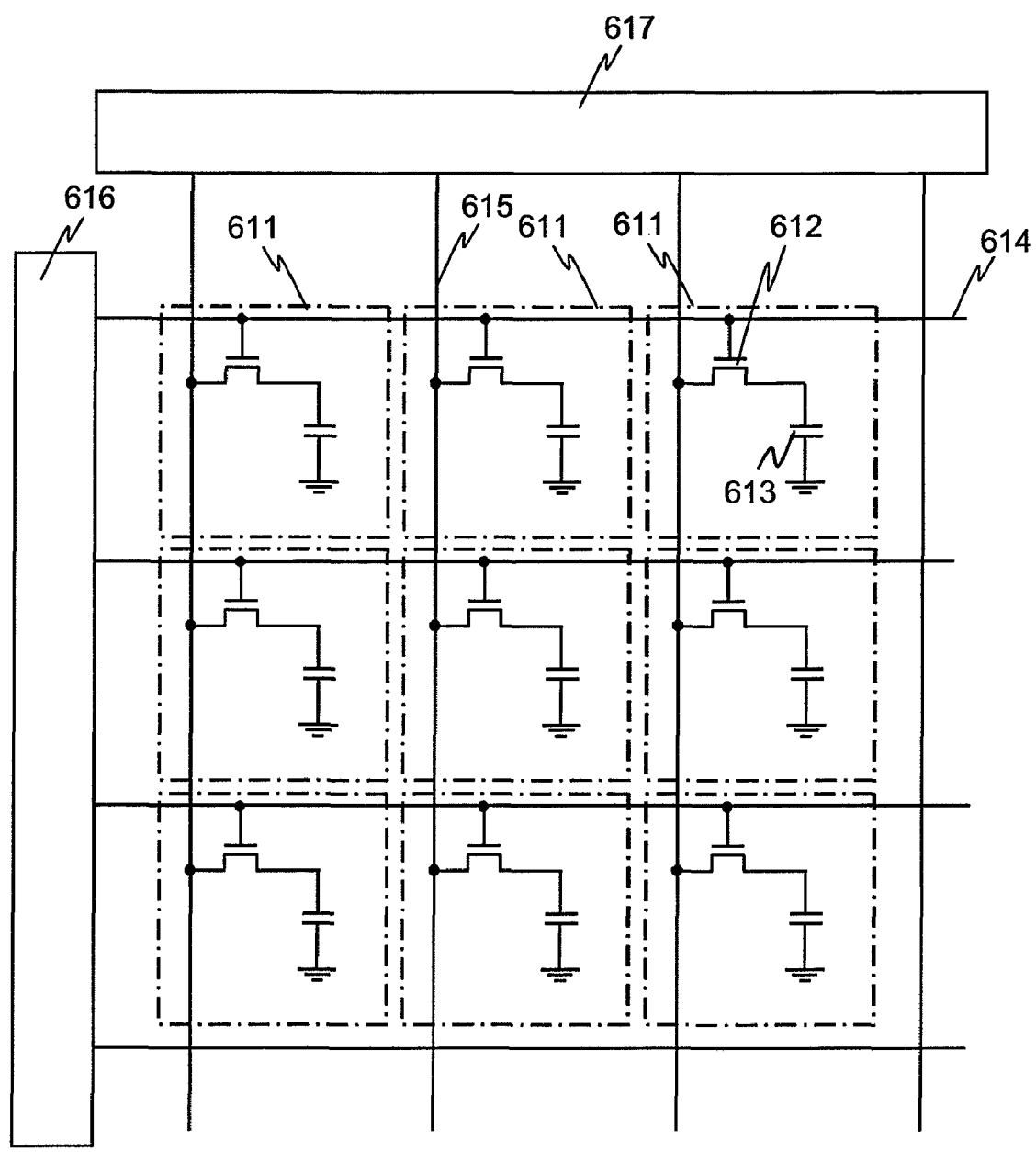
FIG. 5A is an equivalent circuit diagram of the active matrix type display element of a 3×3 pixel unit in which the TFT in the embodiments of the present invention is used in a driving circuit.

FIG. 5A is an equivalent circuit diagram of the active matrix type display element driving circuit for a 3×3 pixel unit in the case of using the TFT of the present invention in the driving circuit.

616 is a scanning line driving circuit which gives a signal to a scanning line 614 with a predetermined cycle. 617 is a data line driving circuit which gives an image data signal to the data line 615. 611 is a pixel unit selectively driven by these circuits. Each pixel unit 611 is consisted of a pixel 613, a pixel selecting TFT 612, and related wirings. Because an active matrix type display element driving circuit for driving a liquid crystal is exemplified in the present embodiment, the pixel 613 is equivalently shown as a capacitance. Also in the case of a display having a higher number of pixels, because it is an active matrix type, only increasing the pixel unit is favorable.

Figure 5B:
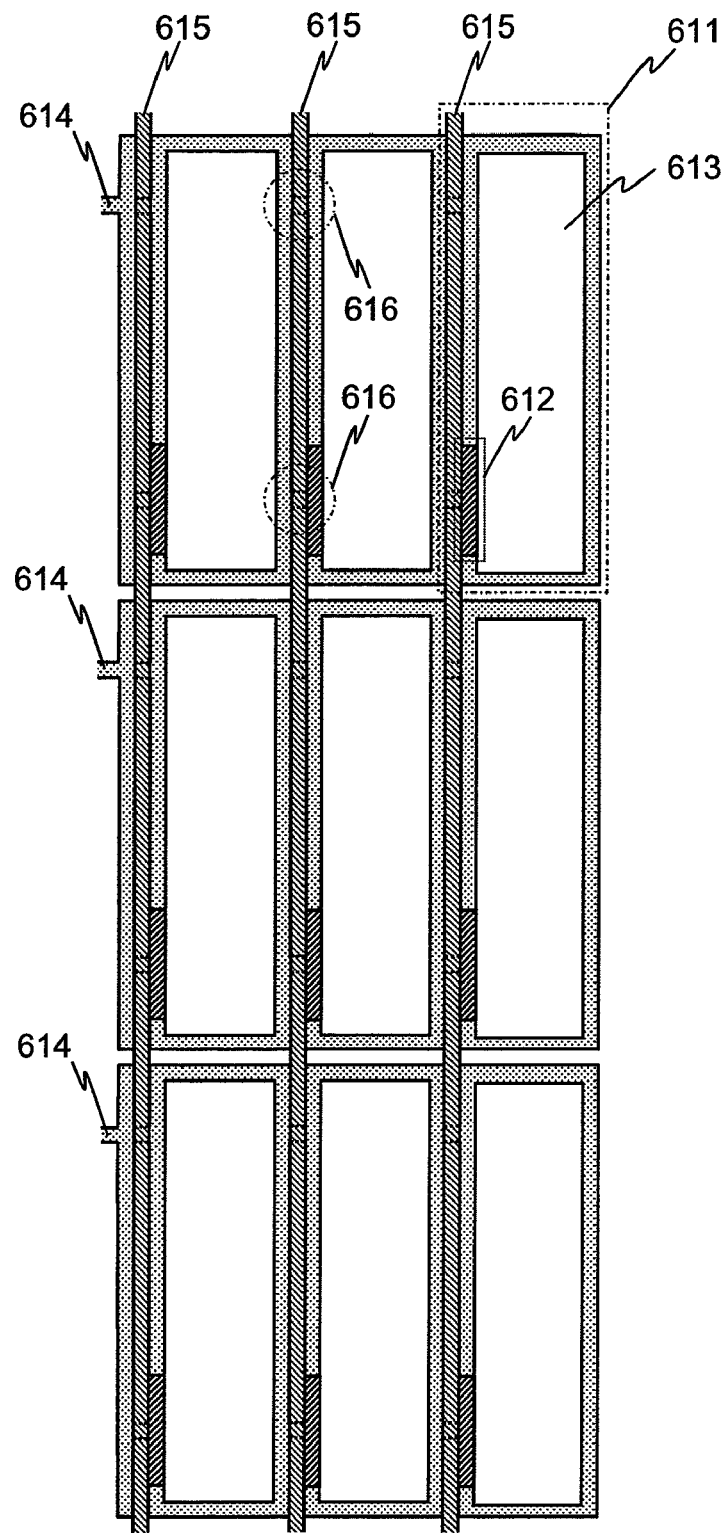
FIG. 5B is a diagram showing a specific configuration embodiment of the pixel unit of FIG. 5A.

FIG. 5B is a figure showing a specific configuration example of FIG. 5A. The manufacturing method of each pixel unit is the same as the method described in Embodiment 2. The outline is explained below.

First, a metal wiring having a pattern of the scanning line 614 is printed and molded on the polyimide sheet substrate. The width of the wiring is 50 μm. The scanning line 614 also serves as the gate electrode of the pixel selecting TFT 612. In FIG. 5B, it is arranged that the circumference of each pixel is surrounded by the scanning line 614 and each space between pixels is connected by the part shown in 616. After forming the scanning line 614, an insulation film is formed with PMMA and a wiring pattern of the data line 615 is manufactured preceding the formation of the channel of the pixel selecting TFT 612.

In the Applied Embodiment, an i-line photosensitive lyophobic film is applied as the photosensitive thin film. In this condition, by irradiating an i-line from the backside, only the top of the scanning line pattern can be made to have the lyophobicity. The conductive ink is applied with a dispensing machine having a scanning mechanism, a heating mechanism, and a function of adjusting the dropping amount, and the pattern of the data line 615 is formed. A gold ultrafine particle dispersion liquid is used as the conductive ink. At this time, the scanning line is running across the data line pattern in the region shown in 616. However, by designing the width of the scanning line of the 616 part narrow with respect to the width of the data line, the conductive ink applied on the scanning line of the 616 part forms a continuous straight line without break. Continuingly, the above-described conductive ink is supplied to the region 613 corresponding to the pixel, and a pixel opposing electrode is formed. Here, an i-line is irradiated from the surface, that is the opposite side from the substrate, and an i-line photosensitive type lyophobic film on the scanning line is removed. The substrate is dipped in a thiol-based lyophobic SAM film having a thiol group at the end, and the thiol-based lyophobic film if formed on the metal film of the data line 615 and the pixel opposing electrode 613. By forming a semiconductor organic molecule thin film as same in the method shown in Embodiment 2, the pixel selecting TFT 612 can be formed. Also in the present Applied Embodiment, the gate electrode, the channel, and the source/drain electrodes can be positioned and self-aligned using a backside exposure.

By applying polyimide on the top layer and baking, a protective film can be formed. After that, if an ITO film is formed using an ITO paint, etc. and made to be an upper electrode after forming a crystal film in a pixel region with the known method, the pixel and its driving circuit can be formed. If the scanning line driving circuit 616 and the data line driving circuit 617 are constructed appropriately therein as shown in FIG. 5A, an active matrix type display element can be constructed.

Because a manufacturing method by printing and coating is used in the present Applied Embodiment such that PMMA is used in the formation of the insulation film and that the conductive ink is used in the formation of the data line 616, a sharp reduction of the manufacturing cost and a drastic cutoff of the manufacturing steps compared to the photolithography method are possible. In the case of using a printing and coating method, the alignment error of each wiring pattern becomes large compared to the lithography method. However, because the requirement of an alignment error required in the image element control circuit is greatly eased compared to the alignment error required in a logic circuit, etc., there is no problem if it is about 30 μm of the alignment error with an inkjet. It is needless to say that a film forming method in vacuum used in an ordinary semiconductor element manufacturing step can be used instead of the printing and coating method. By using the ordinary semiconductor element manufacturing step, there is an advantage that the alignment of each wiring pattern can be preformed precisely.

According to the embodiments of the present invention, because the crystals of the semiconductor organic molecules forming a channel can be highly oriented to the necessary direction, it is possible to manufacture a TFT with large carrier mobility. Further, because the present invention uses liquid in the formation of the channel and is possible to be manufactured with a coating method and an inkjet method, the TFT can be manufactured easily and at a low cost.

According to the embodiments of the present invention, by applying the above-described coating and printing technology using a substrate having flexibility, it is expected that a flexible display device driving circuit can be formed.

According to the embodiments of the present invention, an organic TFT is provided with a high performance in which a semiconductor organic molecule thin film constructing a channel is highly oriented.

What is claimed is:

1. A manufacturing method of a field effect transistor, comprising steps of:
   providing a patterned gate electrode on a substrate, and a gate insulator is provided on the substrate and the gate electrode;
   providing a source electrode and a drain electrode spaced apart from each other on the gate insulator;
   providing a region that is to be a channel between the source electrode and the drain electrode;
   wherein a first boundary between the region and either one of the source electrode and the drain electrode is linear,
   a second boundary between the region and either one of the source electrode and the drain electrode is non-linear,
   the second boundary is continuous or discontinuous, and the boundary part has a plurality of recess parts,
   the surface of the region has higher hydrophilicity than other regions, and the periphery of the region is provided with a member having higher water-repellency than the region; and
   supplying a solution including semiconductor organic molecules to the region, and drying the solution.

2. The manufacturing method of a field effect transistor according to claim 1,
wherein the geometrical shape of the recess parts has at least one of a square, a triangle, a semicircle, or a wave shape.

3. The manufacturing method of a field effect transistor according to claim 1,
wherein the recess parts contribute to the solution in the region to be the channel being dried first from the side of the first boundary.

4. The manufacturing method of a field effect transistor according to claim 1 having a step of dipping the member in the solution in a container, and then taking out the member from the container.

5. The manufacturing method of a field effect transistor according to claim 1,
wherein, by the solution in the region to be the channel being dried and becoming crystal grains, the crystal grains compose a channel.

6. The manufacturing method of a field effect transistor according to claim 1,
wherein the surface of the region to be the channel is formed surrounded with a solid body including the source electrode and the drain electrode when viewed planarly, lyophilicity of the surface of the region is relatively high compared to its peripheral part, and the lyophobicity of the peripheral part is relatively high compared to the surface of the region.

7. The manufacturing method of a field effect transistor according to claim 1,
wherein the surface of the region to be the channel is in a position lower than the peripheral region including the source electrode and the drain electrode when viewed planarly.

8. A manufacturing method of a field effect transistor, comprising steps of:
providing a gate electrode on a substrate, and providing a gate insulator on the substrate and the gate electrode;
providing a source electrode and a drain electrode spaced apart from each other on the gate insulator;
providing a region that is to be a channel between the source electrode and the drain electrode;
wherein a first boundary between the region and the source electrode has a first linear part and a first non-linear part,
a second boundary between the region and the drain electrode has a second linear part and a second non-linear part,
the first and the second non-linear parts of the first and the second boundaries are continuous or discontinuous, and the boundary parts have a plurality of recess parts,
the first and the second non-linear parts are in a position nearly symmetrical to the center line of the region in the parallel direction to the first and the second boundaries of the region,
the surface of the region has higher hydrophilicity than the other regions, and the periphery of the region prepares a member having higher water-repellency than the region; and
supplying a solution including semiconductor organic molecules to the region, and drying the solution.

9. The manufacturing method of a field effect transistor according to claim 8,
wherein the geometrical shape of the recess parts has at least one of a square, a triangle, a semicircle, or a wave shape.

10. The manufacturing method of a field effect transistor according to claim 8,
wherein the recess parts contribute to the solution in the region to be the channel being dried first from the side of the first boundary.

11. The manufacturing method of a field effect transistor according to claim 8 having a step of dipping the member in the solution in a container, and then taking out the member from the container.

12. The manufacturing method of a field effect transistor according to claim 8,
wherein, by the solution in the region to be the channel being dried and becoming crystal grains, the crystal grains compose a channel.

13. The manufacturing method of a field effect transistor according to claim 8,
wherein the surface of the region to be the channel is formed surrounded with a solid body including the source electrode and the drain electrode when viewed planarly, lyophilicity of the surface of the region is relatively high compared to its peripheral part, and the lyophobicity of the peripheral part is relatively high compared to the surface of the region.

14. The manufacturing method of a field effect transistor according to claim 8,
wherein the surface of the region to be the channel is in a position lower than the peripheral region including the source electrode and the drain electrode when viewed planarly.

15. The manufacturing method of a field effect transistor according to claim 8,
wherein each one of the first linear part and the first non-linear part is located on the first boundary, and each one of the second linear part and the second non-linear part is located on the second boundary.

16. A field effect transistor, comprising:
a gate electrode provided on a substrate;
a gate insulator provided on the substrate and the gate electrode;
a source electrode and a drain electrode spaced apart from each other provided on the gate insulator;
a region to be a channel provided between the source electrode and the drain electrode;
wherein a first boundary between the region and either one of the source electrode and the drain electrode is linear,
a second boundary between the region and either one of the source electrode and the drain electrode is non-linear, the second boundary is continuous or discontinuous, and the boundary part has a plurality of recess parts;
the surface of the region has higher hydrophilicity than the other regions, and the periphery of the region has a member having higher water-repellency than the region; and
a channel with a semiconductor organic molecule provided in the region.

17. The field effect transistor according to claim 16,
wherein the geometrical shape of the recess parts has at least one of a square, a triangle, a semicircle, or a wave shape.

18. The field effect transistor according to claim 16, wherein the surface of the region to be the channel is formed surrounded with a solid body including the source electrode and the drain electrode when viewed planarly, lyophilicity of the surface of the region is relatively high compared to its peripheral part, and the lyophobicity of the peripheral part is relatively high compared to the surface of the region.

19. The field effect transistor according to claim 16, wherein the surface of the region to be the channel is in a position lower than the peripheral region including the source electrode and the drain electrode when viewed planarly.

* * * * *